(12) United States Patent
Katrak

(10) Patent No.: US 10,996,279 B2
(45) Date of Patent: May 4, 2021

(54) DIAGNOSTIC SYSTEM FOR A BATTERY MANAGEMENT SYSTEM

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 158 days.

(21) Appl. No.: 16/377,423

(22) Filed: Apr. 8, 2019

(65) Prior Publication Data

US 2020/0319252 A1  Oct. 8, 2020

(51) Int. Cl.
*G01R 31/367* (2019.01)
*G01R 31/36* (2020.01)

(52) U.S. Cl.
CPC ....... *G01R 31/367* (2019.01); *G01R 31/3648* (2013.01)

(58) Field of Classification Search
CPC .............. G06F 16/901; G06F 16/9014; G06F 16/9017; G06F 11/0772; G01R 31/367
USPC ......................................................... 702/63
See application file for complete search history.

(56) References Cited

U.S. PATENT DOCUMENTS

| | | | |
|---|---|---|---|
| 7,523,349 B2 | 4/2009 | Barras | |
| 9,555,800 B2 | 1/2017 | Hynes et al. | |
| 9,972,375 B2 | 5/2018 | Parks et al. | |
| 2017/0373358 A1* | 12/2017 | Katrak | G06F 13/38 |
| 2020/0091562 A1* | 3/2020 | Mi | H01M 10/4207 |

* cited by examiner

*Primary Examiner* — Ricky Go
(74) *Attorney, Agent, or Firm* — Buckert Patent & Trademark Law Firm PC; John F. Buckert

(57) ABSTRACT

A diagnostic system for a battery management system is provided. The diagnostic system includes a microcontroller having application-specific components. A first BMS diagnostic handler application sends a first index value to an application-specific component diagnostic safety application. The application-specific component diagnostic safety application accesses an application-specific component diagnostic flag in a first table in a RAM if the first index value is equal to a valid index value in a first table. The application-specific component diagnostic safety application sends the application-specific component diagnostic flag to the first BMS diagnostic handler application.

11 Claims, 17 Drawing Sheets

MASTER MICROCONTROLLER INDEX TABLE ~600

| APPLICATION SPECIFIC COMPONENT NAME | INDEX NAME (HEXADECIMAL) | VALID INDEX VALUE (HEXADECIMAL) | |
|---|---|---|---|
| ADC | FIRST INDEX | 1EE1 | ~602 |
| DMA | SECOND INDEX | 4BB4 | ~604 |
| PLL | THIRD INDEX | D44D | ~606 |
| ECM | FOURTH INDEX | 2772 | ~608 |
| CLOCK | FIFTH INDEX | 7447 | ~610 |

FIG. 3

MASTER TABLE FOR APPLICATION-SPECIFIC COMPONENT DIAGNOSTIC FLAGS ~620

| APPLICATION-SPECIFIC COMPONENT DIAGNOSTIC FLAG NAME | VALID INDEX VALUE (HEXADECIMAL) | NON-FAULT VALUE (HEXADECIMAL) | FAULT VALUE (HEXADECIMAL) | |
|---|---|---|---|---|
| ADC DIAGNOSTIC FLAG | 1EE1 | D88D | 8DD8 | ~622 |
| DMA DIAGNOSTIC FLAG | 4BB4 | E22E | 2EE2 | ~624 |
| PLL DIAGNOSTIC FLAG | D44D | 1BB1 | B11B | ~626 |
| ECM DIAGNOSTIC FLAG | 2772 | B44B | 4BB4 | ~628 |
| CLOCK DIAGNOSTIC FLAG | 7447 | 4DD4 | D44D | ~630 |

FIG. 4

FIRST TABLE IN RAM - FOR ADC ~640

| FIRST VALID INDEX VALUE (HEXADECIMAL) | ADC DIAGNOSTIC FLAG (HEXADECIMAL) | |
|---|---|---|
| 1EE1 | XXXX | ~642 |

FIG. 5

SECOND TABLE IN RAM - FOR DMA  ←650

| SECOND VALID INDEX VALUE (HEXADECIMAL) | DMA DIAGNOSTIC FLAG (HEXADECIMAL) |
|---|---|
| 4BB4 | XXXX |

THIRD TABLE IN RAM - FOR PLL  ←660

| THIRD VALID INDEX VALUE (HEXADECIMAL) | PLL DIAGNOSTIC FLAG (HEXADECIMAL) |
|---|---|
| D44D | XXXX |

FOURTH TABLE IN RAM - FOR ECM  ←670

| FOURTH VALID INDEX VALUE (HEXADECIMAL) | ECM DIAGNOSTIC FLAG (HEXADECIMAL) |
|---|---|
| 2772 | XXXX |

FIFTH TABLE IN RAM - FOR CLOCK  ←680

| FIFTH VALID INDEX VALUE (HEXADECIMAL) | CLOCK DIAGNOSTIC FLAG (HEXADECIMAL) |
|---|---|
| 7447 | XXXX |

DIAGNOSTIC SYSTEM FOR A BATTERY MANAGEMENT SYSTEM

BACKGROUND

In diagnostic systems for battery management systems, when two diagnostic handler applications directly access a diagnostic flag in a random access memory (RAM), there exists a possibility that one of the diagnostic handler applications could inadvertently overwrite the memory diagnostic flag to an invalid value.

The inventor herein has recognized a need for an improved diagnostic system for a battery management system that eliminates the above-mentioned problem.

SUMMARY

A diagnostic system for a battery management system is provided. The diagnostic system includes a cell voltage monitoring IC that monitors voltages of a plurality of battery cells. The diagnostic system further includes a microcontroller having a random-access memory (RAM), application-specific components, a first battery management system (BMS) diagnostic handler application, and an application-specific component diagnostic safety application. The microcontroller is operably coupled to the cell voltage monitoring integrated circuit (IC). The first BMS diagnostic handler application sends a first index value to the application-specific component diagnostic safety application. The first index value is associated with a first application-specific component of the application-specific components. The application-specific component diagnostic safety application accesses an application-specific component diagnostic flag in a first table in the RAM if the first index value is equal to a valid index value in the first table. The application-specific component diagnostic flag has a first fault value if any of the plurality of diagnostic flags indicate a fault condition in the first application-specific component. The application-specific component diagnostic flag has a first non-fault value if all of a plurality of diagnostic flags indicate a non-fault condition in the first application-specific component. The first index value, the first fault value, and the first non-fault value each have a Hamming distance of at least eight from one another. The application-specific component diagnostic safety application sends the application-specific component diagnostic flag to the first BMS diagnostic handler application.

BRIEF DESCRIPTION OF THE DRAWINGS

FIG. 3 is a master microcontroller index table having a plurality of records in which each record has an application-specific component name, an index name, and a valid index value;

FIG. 4 is a master table for application-specific component diagnostic flags having a plurality of records in which each record has an application-specific component diagnostic flag name, a valid index value, and non-fault value, and a fault value;

FIG. 5 is a first table associated with an ADC having a record with a first valid index value and an ADC diagnostic flag;

FIG. 6 is a second table associated with a DMA module having a record with a second valid index value and a DMA memory diagnostic flag;

FIG. 7 is a third table associated with a PLL having a record with a third valid index value and a PLL diagnostic flag;

FIG. 8 is a fourth table associated with an ECM having a record with a fourth valid index value and an ECM diagnostic flag;

FIG. 9 is a fifth table associated with a clock having a record with a fifth valid index value and a clock diagnostic flag.

DETAILED DESCRIPTION

Figure 1:
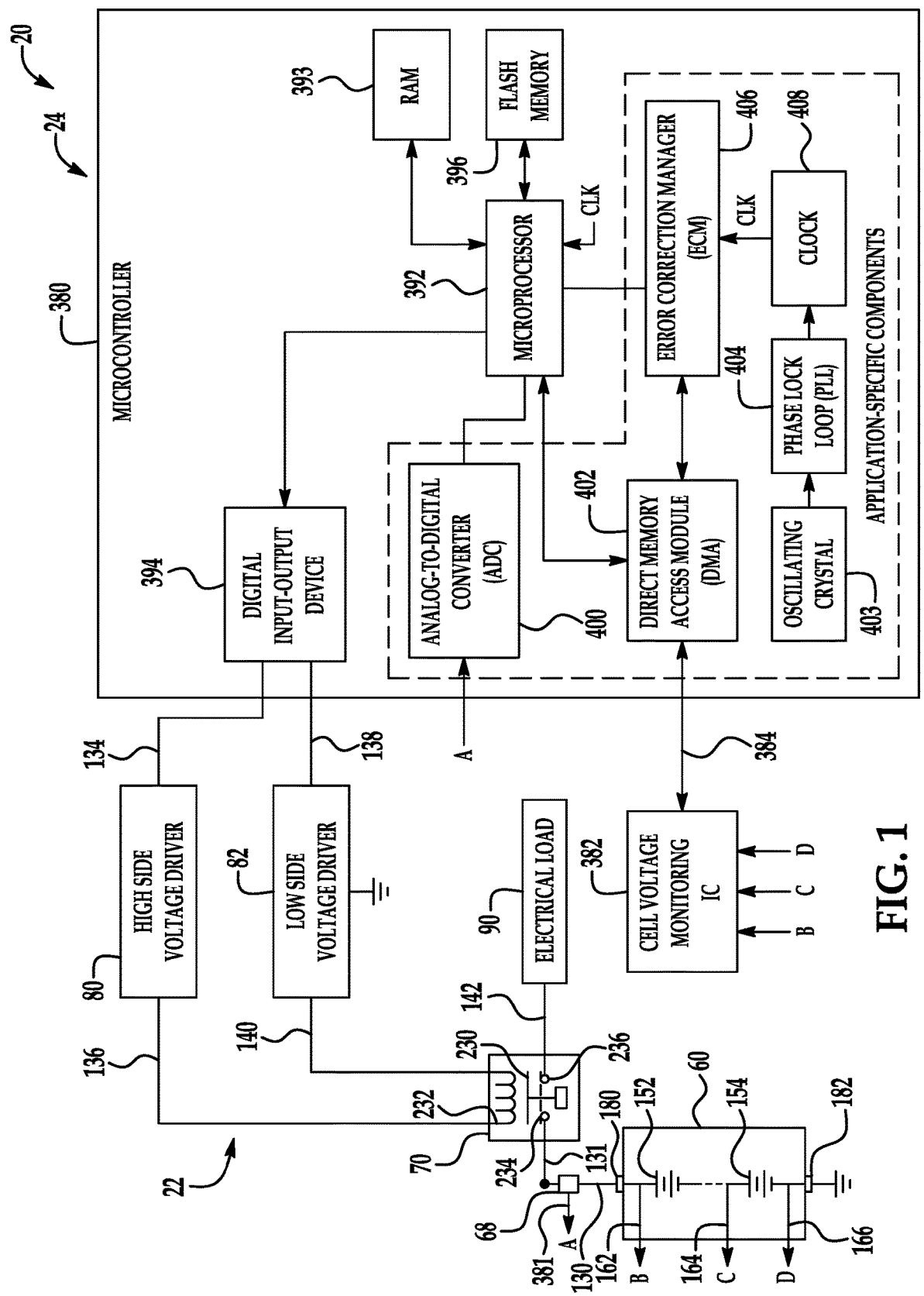
FIG. 1 is a schematic of a vehicle having a diagnostic system for a battery management system in accordance with an exemplary embodiment.

Referring to FIG. 1, a vehicle 20 is provided. The vehicle 20 includes a vehicle electrical system 22, and a diagnostic system 24 in accordance with an exemplary embodiment.

The vehicle electrical system 22 includes a battery 60, a fuse 68, a contactor 70, a high side voltage driver 80, a low side voltage driver 82, an electrical load 90, and electrical lines 130, 131, 134, 136, 138, 140, 142.

An advantage of the diagnostic system 24 is that the system 24 utilizes a diagnostic handler application that sends an index value to an application-specific component diagnostic safety application, and in response the application-specific component diagnostic safety application accesses a diagnostic flag in RAM and sends the diagnostic flag to the diagnostic handler application. Further, the diagnostic handler application can take safe action if the diagnostic flag indicates a fault condition. By utilizing the index value, the diagnostic handler application cannot directly access the diagnostic flag in the RAM which prevents the diagnostic handler application from inadvertently overwriting the diagnostic flag in the RAM.

The term "node" or "electrical node" refers to a region or a location in an electrical circuit.

The term "IC" refers to an integrated circuit.

The term "ADC" refers to an analog-to-digital converter.

The term "DMA" refers to a direct memory access that receives data from a cell voltage monitoring IC.

The term "PLL" refers to a phase lock loop that multiples a frequency of a signal received from an oscillating crystal and outputs a higher frequency signal to a clock.

The term "ECM" refers to an error control manager that monitors operation of at least one of an ADC, a DMA, a PLL, and a clock, and to determine whether any of these components are malfunctioning.

The term "clock" refers to a control clock for a microprocessor.

The term "application-specific component" refers to at least one of an ADC, a DMA, a PLL, an ECM, and a clock utilized in a microcontroller.

The term "diagnostic safety mechanism" refers to an application executed during runtime (after a startup operation of the microcontroller) that can access a plurality of diagnostic flags that may indicate a fault condition of an application-specific component during runtime of the microcontroller, and can thereafter set an application-specific component diagnostic flag to either a fault value if any of the plurality of diagnostic flags indicate a fault condition, or a non-fault value if all of the plurality of diagnostic flags indicate a non-fault condition.

The term "diagnostic handler application' refers to an application that can take safe action (e.g., open a contactor) in a vehicle electrical system if a fault condition is detected in an application-specific component of a microcontroller.

Referring to FIG. 1, the battery 60 includes a battery cell 152 and a battery cell 154 electrically coupled to series with one another. The battery 60 further includes a positive terminal 180 electrically coupled to a positive terminal of the battery cell 152, and a negative terminal 182 electrically coupled to a negative terminal of the battery cell 156. In an exemplary embodiment, the battery 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled through a fuse 68 to the positive terminal 180 of the battery 60 utilizing the electrical lines 130, 131. The second node 236 is electrically coupled to the electrical load 90 utilizing the electrical line 142. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 144 energizes the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The diagnostic system 24 is provided to determine whether application-specific components within the microcontroller 380 are operating as desired, and if not, to take safe action to by transitioning the contactor 70 to an open operational state. The diagnostic system 24 includes the microcontroller 380, a cell voltage monitoring IC 382, and a communication bus 384.

The microcontroller 380 is provided to receive data from the cell voltage monitoring IC 382 and to perform self-diagnostic methods to determine whether the microcontroller 380 is operating as desired, and if not, to take safe action. The microcontroller 380 controls operation of the contactor 70 and measures the voltage across the fuse 68.

The microcontroller 380 has the application-specific components including the ADC 400, the DMA 402, an oscillating crystal 403, the PLL 404, the ECM 406, and the clock 408. The microcontroller 380 further includes a microprocessor 392, the RAM 393, the digital input-output device 394, and the flash memory device 396. The operation of the microprocessor 392 will be discussed in greater detail in the flowcharts hereinafter.

The microprocessor 392 is operably coupled to the RAM 393, the digital input-output device 394, the flash memory device 396, the ADC 400, the DMA 402, the ECM 406, and the clock 408.

The digital input-output device 394 is electrically coupled to the high side voltage driver 80 and the low side voltage driver 82 via the electrical lines 134, 138 respectively for controlling operation thereof.

The DMA 402 is operably coupled to the cell voltage monitoring IC 382 via the communication bus 384. The DMA 402 is further operably coupled to the ECM 406. The DMA receives data from the cell voltage monitoring IC 382 that indicates voltages of the battery cells 480, 482. The cell voltage monitoring IC 382 measures a first voltage of the battery cell 152 utilizing the sense lines 162, 164 and generates a first voltage value indicative of the second voltage. Further, the cell voltage monitoring IC 382 measures a second voltage of the battery cell 154 utilizing the sense lines 164, 166 and generates a second voltage value indicative of the first voltage.

The PLL 404 multiples a frequency of a signal received from an oscillating crystal 403 and outputs a higher frequency signal that is received by the clock 408. The PLL 404 is operably coupled to the oscillating crystal 403, the clock 408 and the ECM 406.

The clock 408 outputs a timing signal CLK that is received by the microprocessor 392. The clock 408 is operably coupled to the PLL 404, the ECM 406 and the microprocessor 392.

The ECM 406 monitors operation of the ADC 400, the DMA 402, the PLL 404, the clock 408 to determine whether any of these components are malfunctioning. The ECM 406 is operably coupled to the ADC 400, the DMA 402, the PLL 404, the clock 408, and the microprocessor 392.

Figure 2:
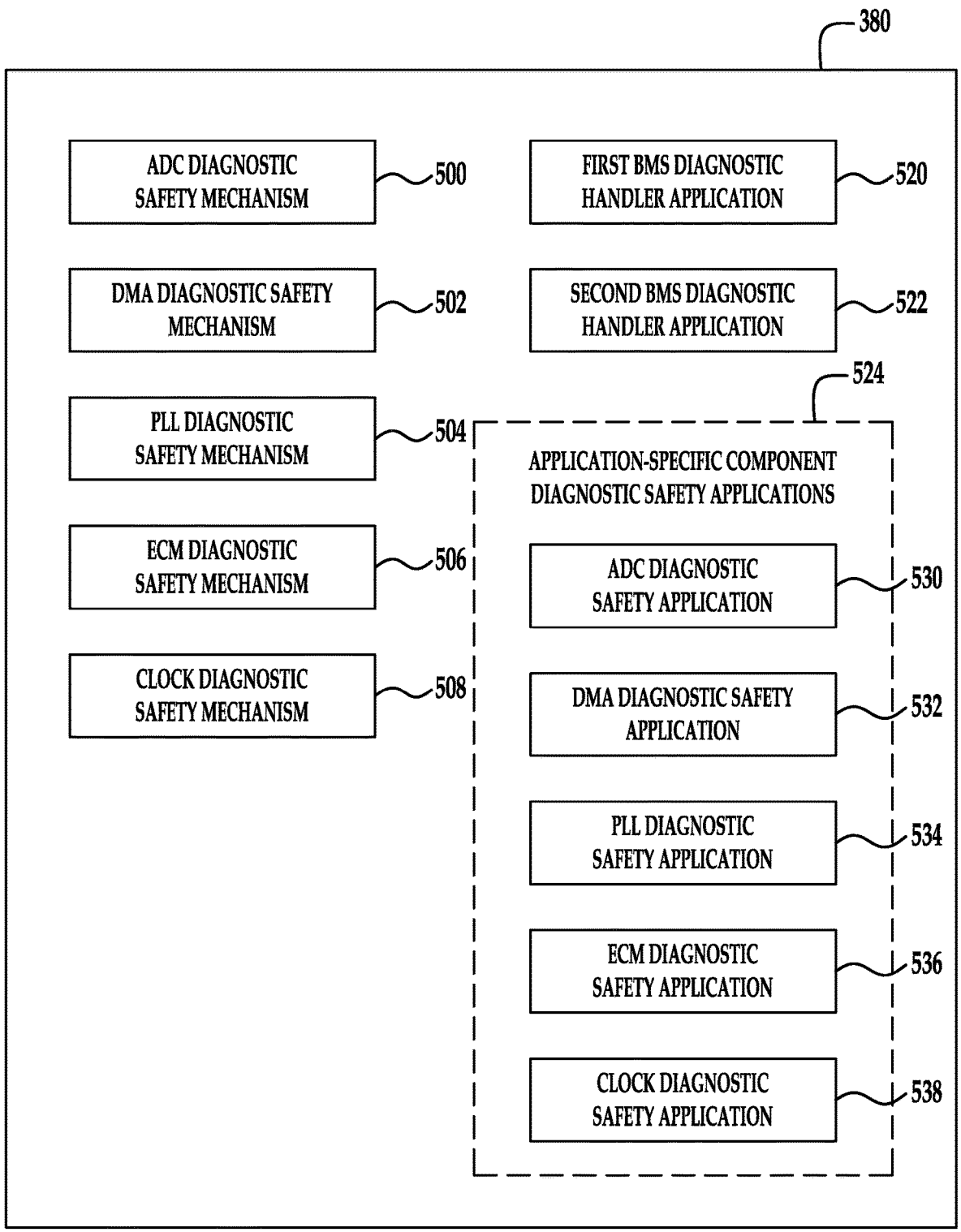
FIG. 2 is a block diagram of applications utilized by the diagnostic system of FIG. 1 including an analog-to-digital converter (ADC) diagnostic safety mechanism, a direct memory access (DMA) diagnostic safety mechanism, a phase lock loop (PLL) diagnostic safety mechanism, an error control manager (ECM) diagnostic safety mechanism, a clock diagnostic safety mechanism, a first BMS diagnostic handler application, a second BMS diagnostic handler application, and application-specific diagnostic safety applications including an ADC diagnostic safety application, a DMA diagnostic safety application, a PLL diagnostic safety application, an ECM diagnostic safety application, and a clock diagnostic safety application.
Figure 10:
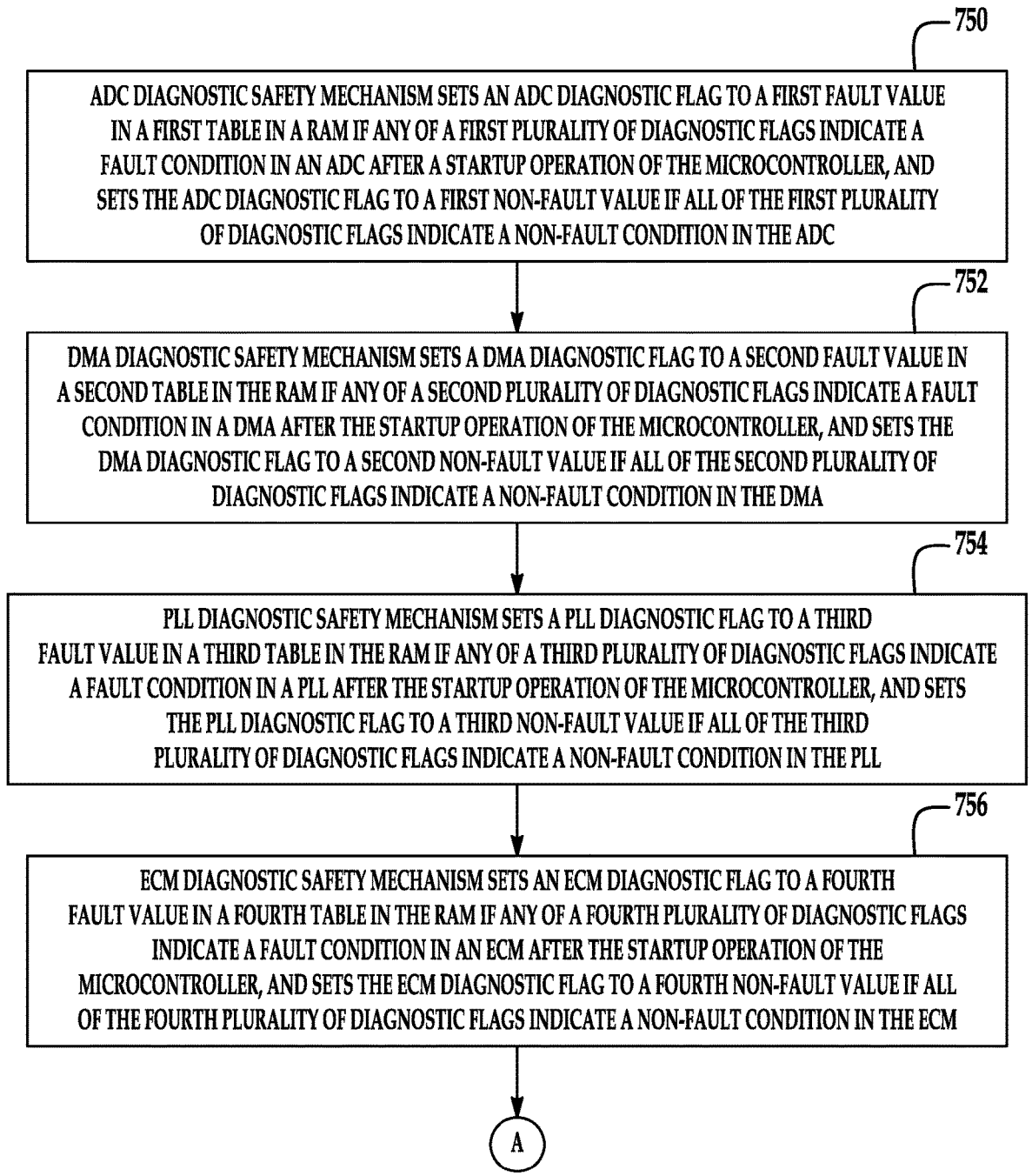
FIGS. 10-22 are flowcharts of a diagnostic method implemented by the diagnostic system of FIG. 1.
Figure 11:
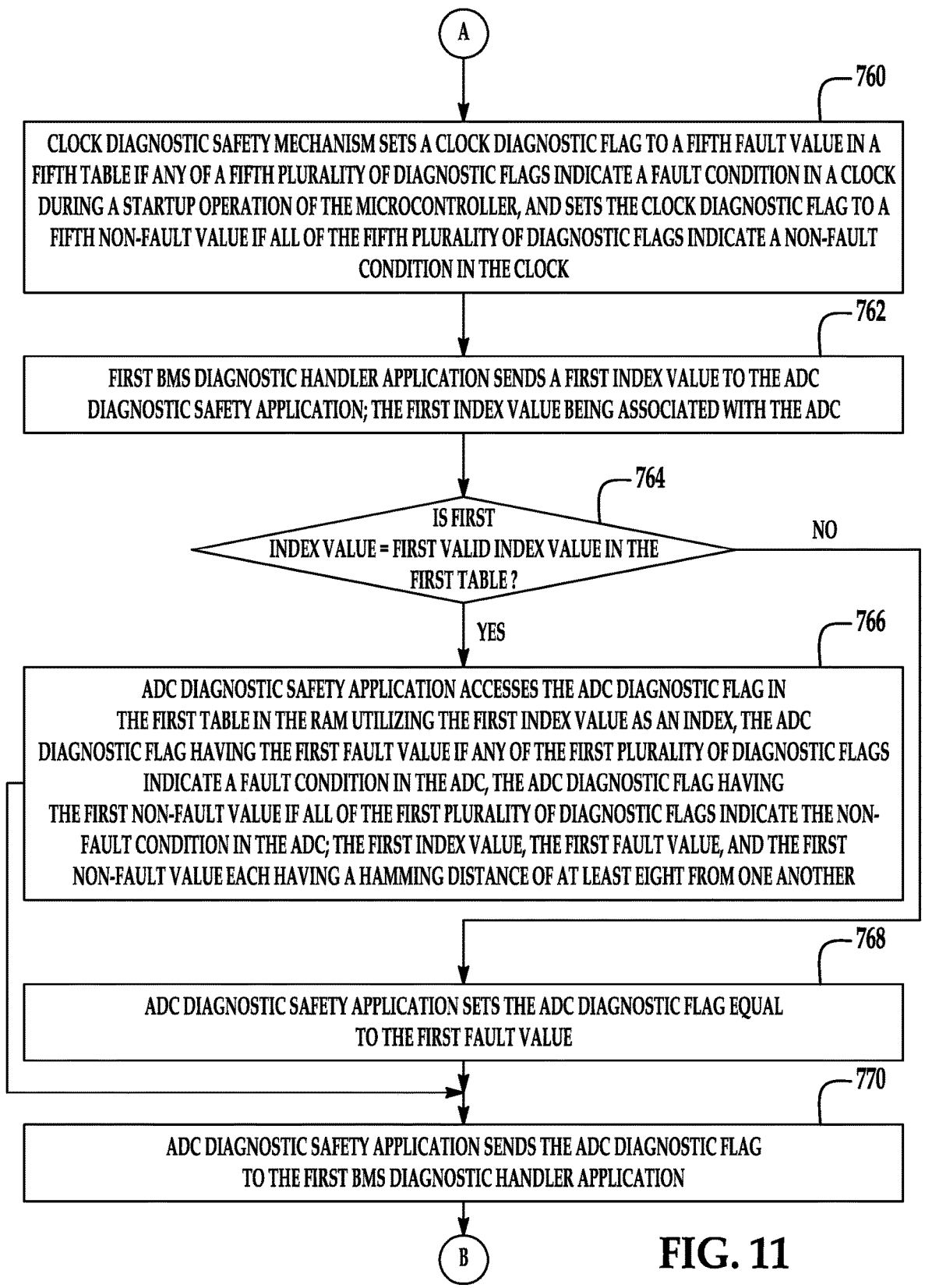
Figure 12:
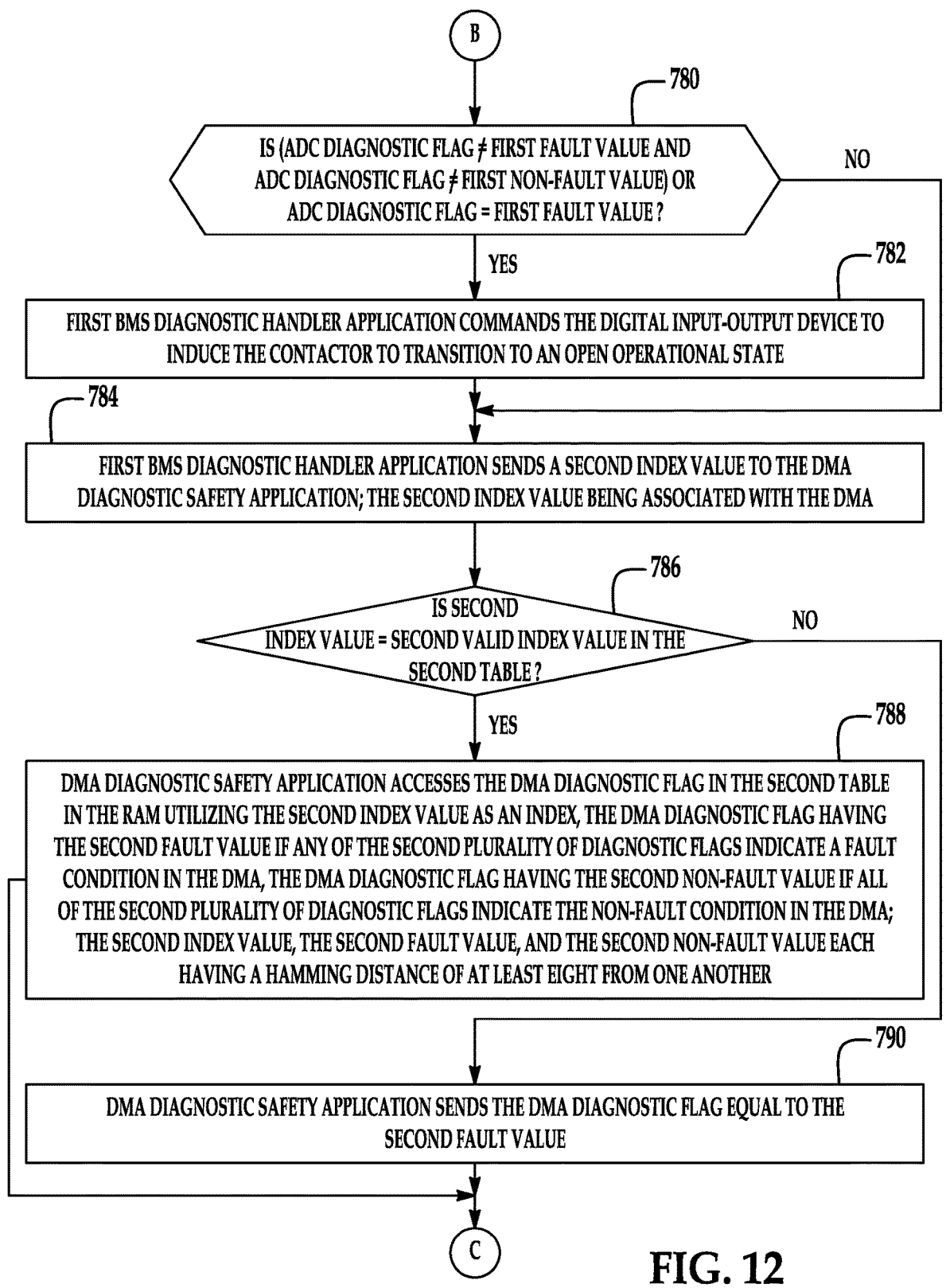
Figure 13:
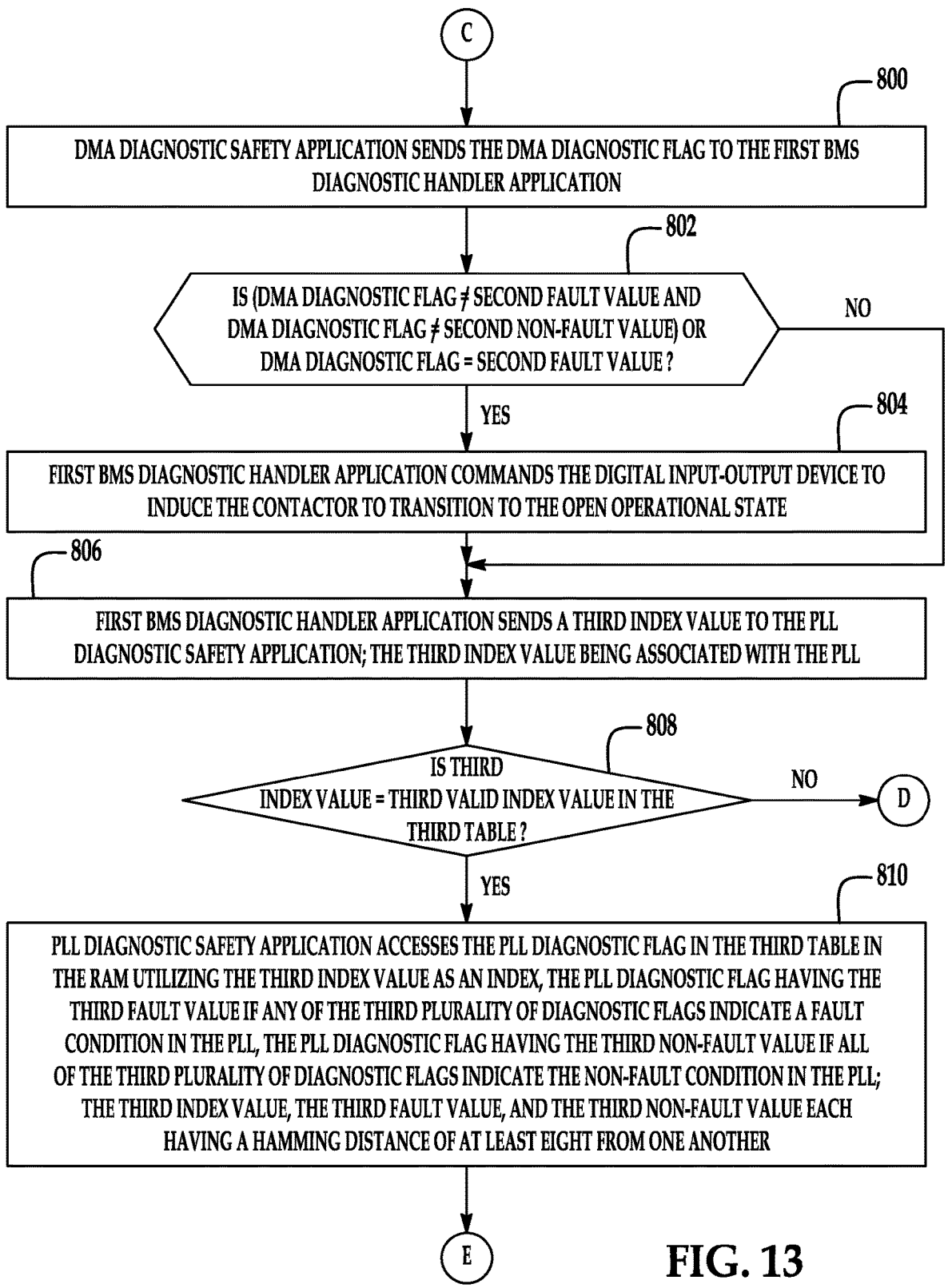
Figure 14:
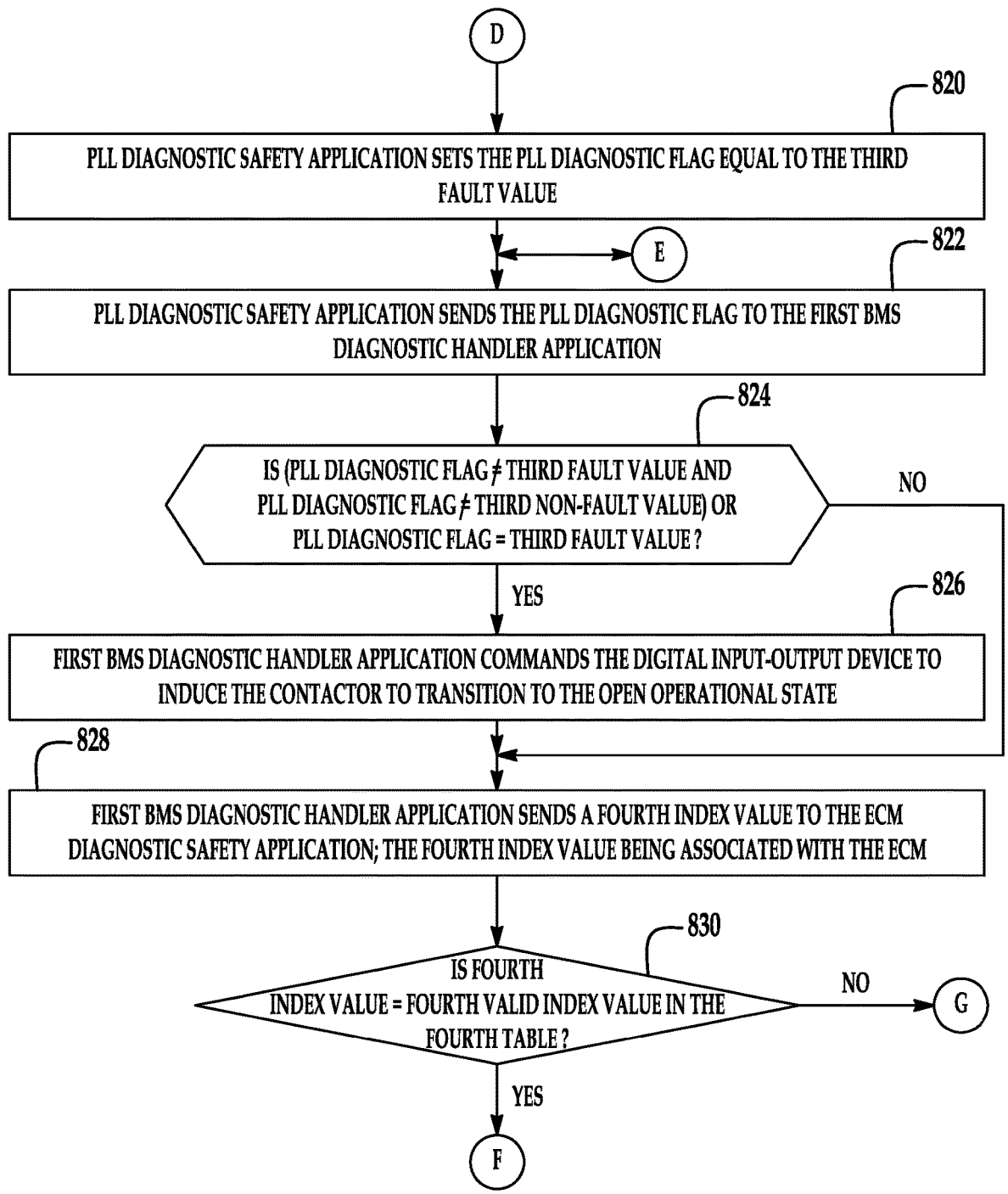
Figure 15:
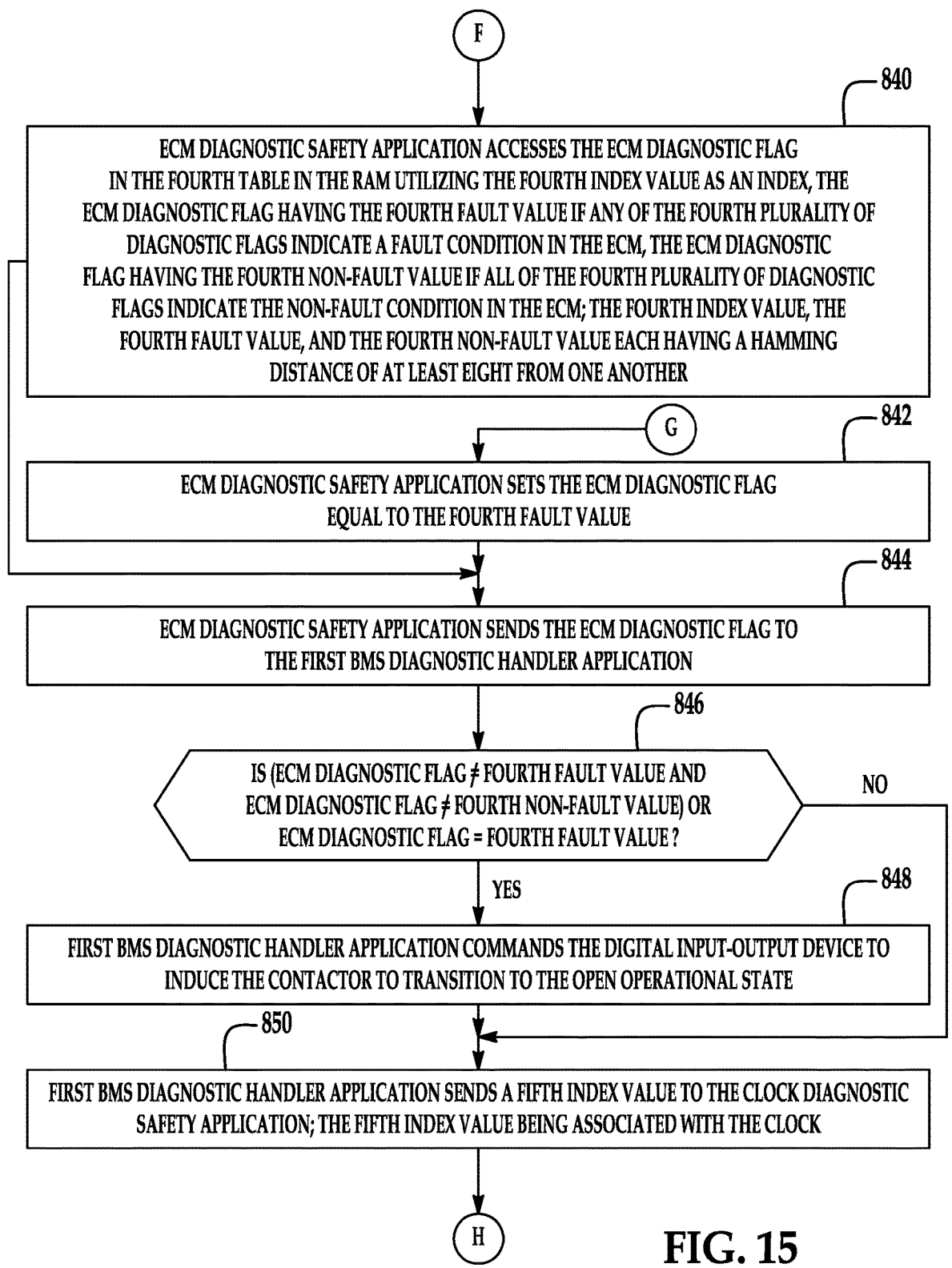
Figure 16:
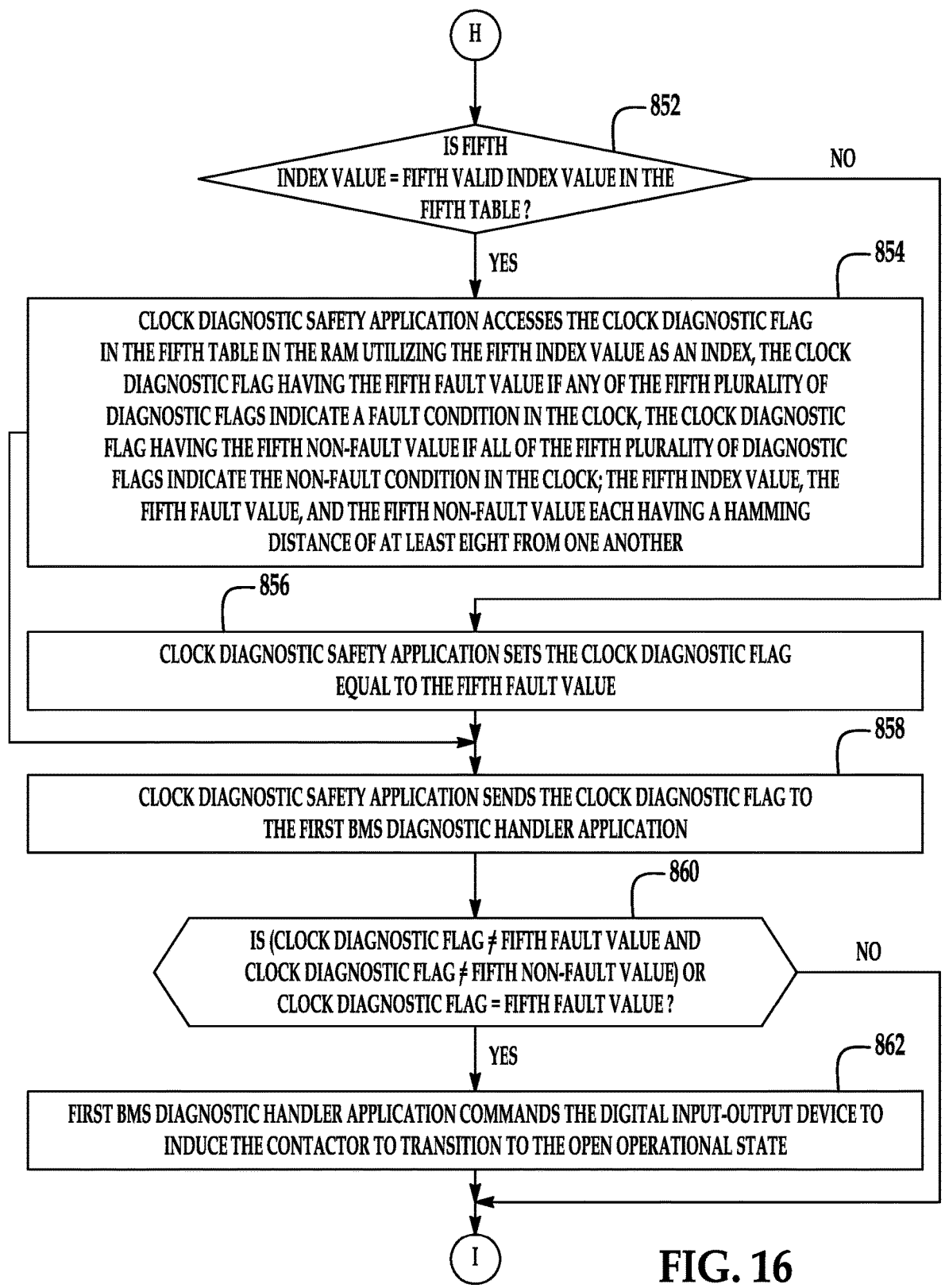
Figure 17:
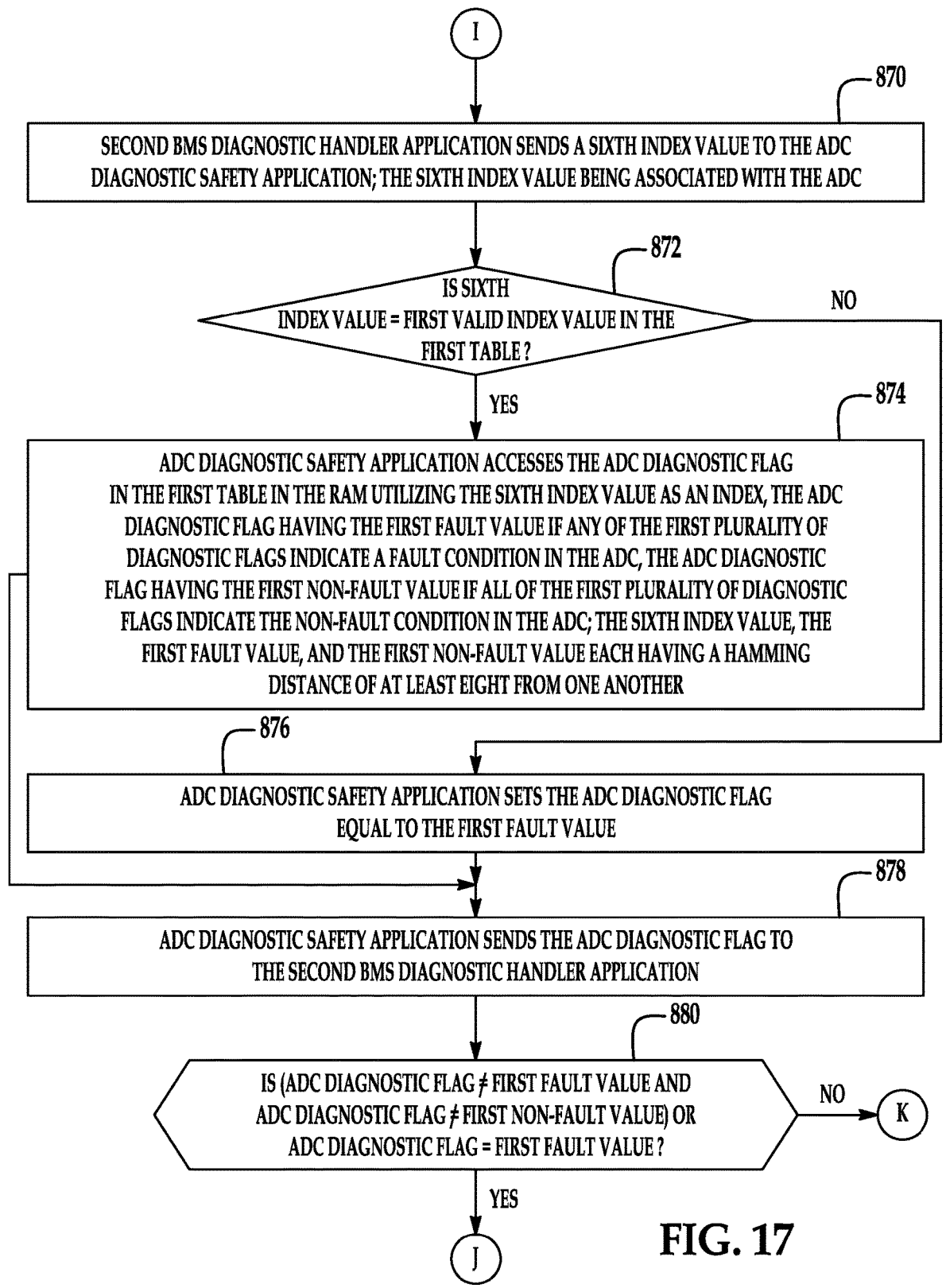
Figure 18:
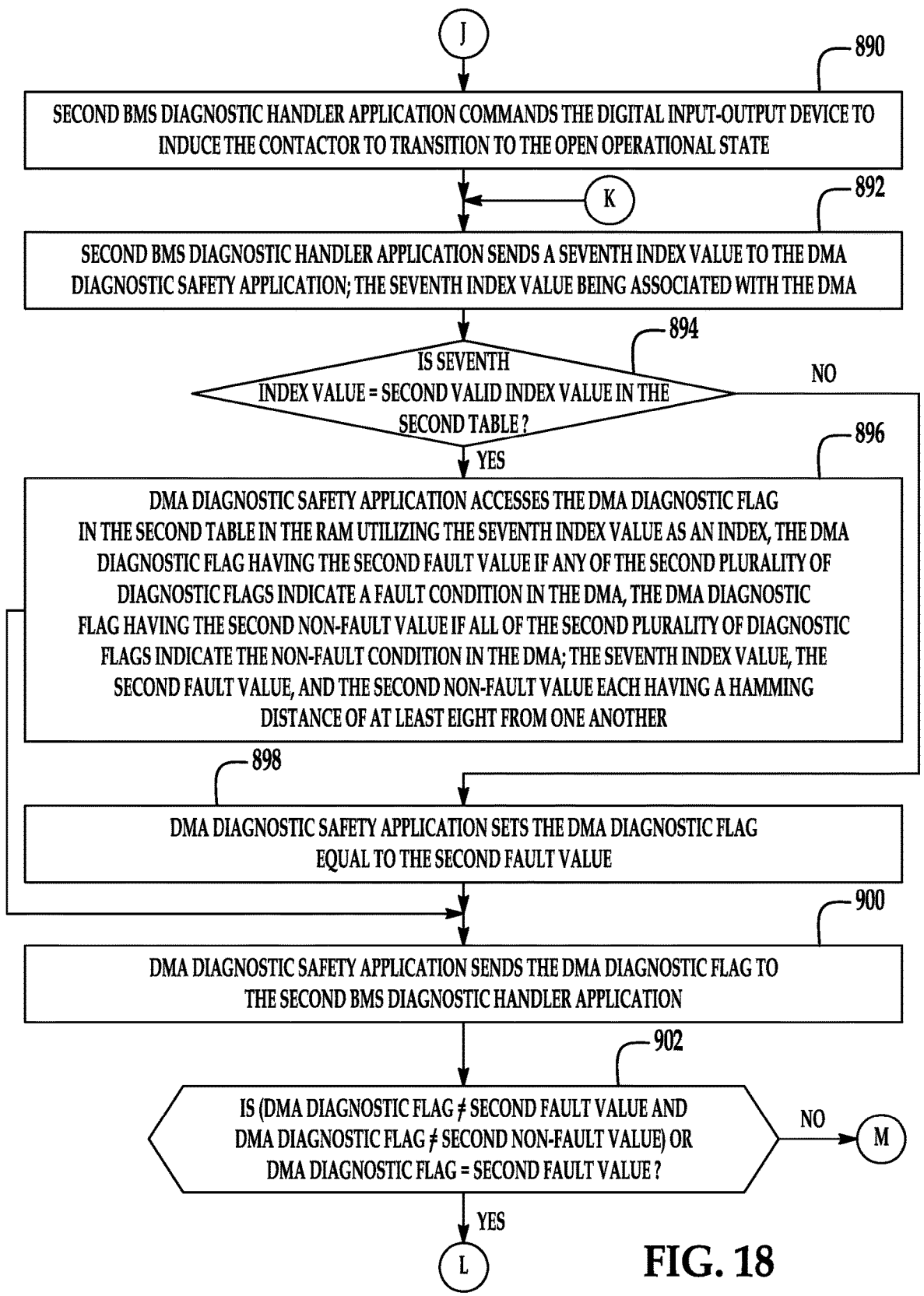
Figure 19:
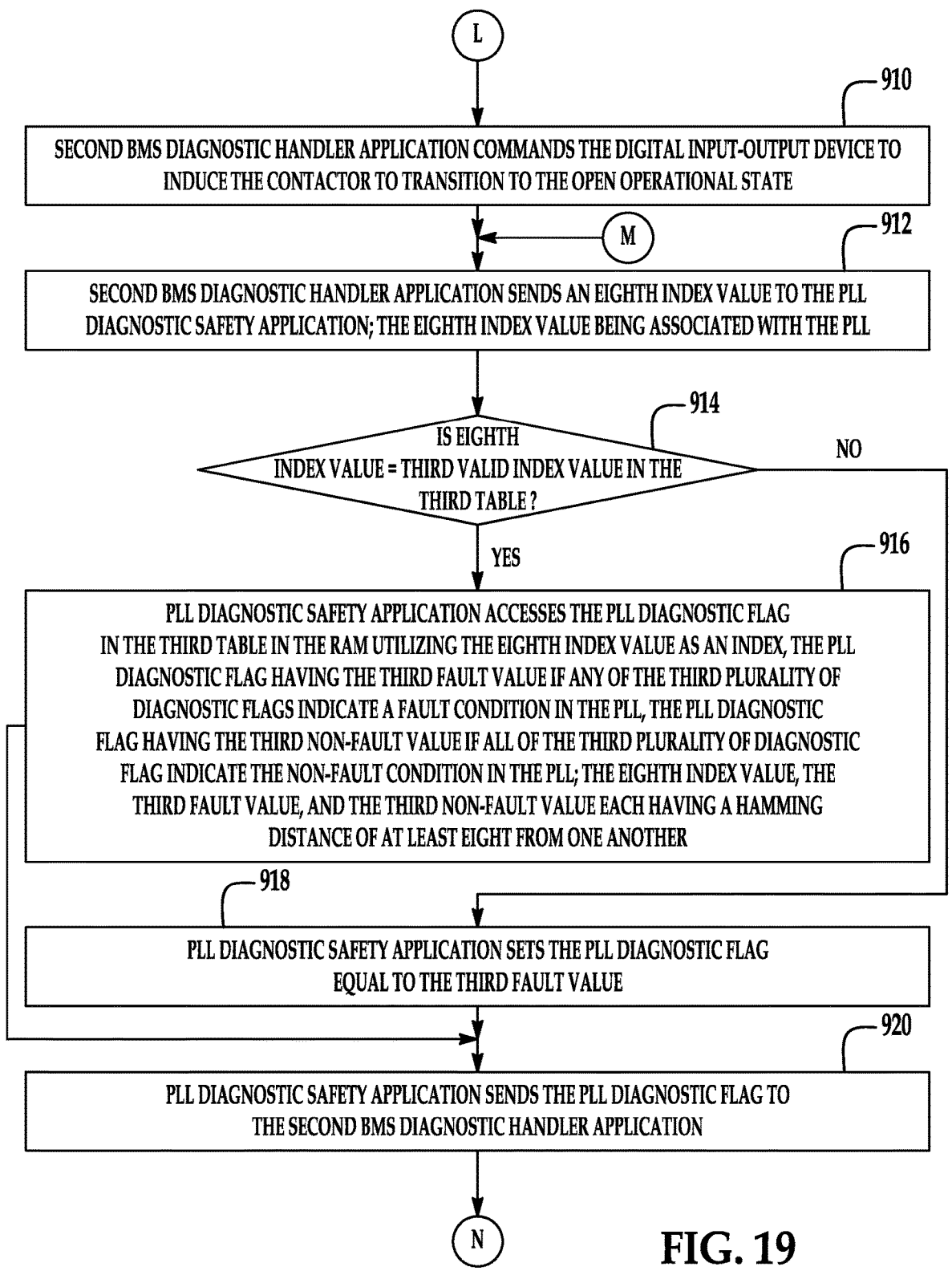
Figure 20:
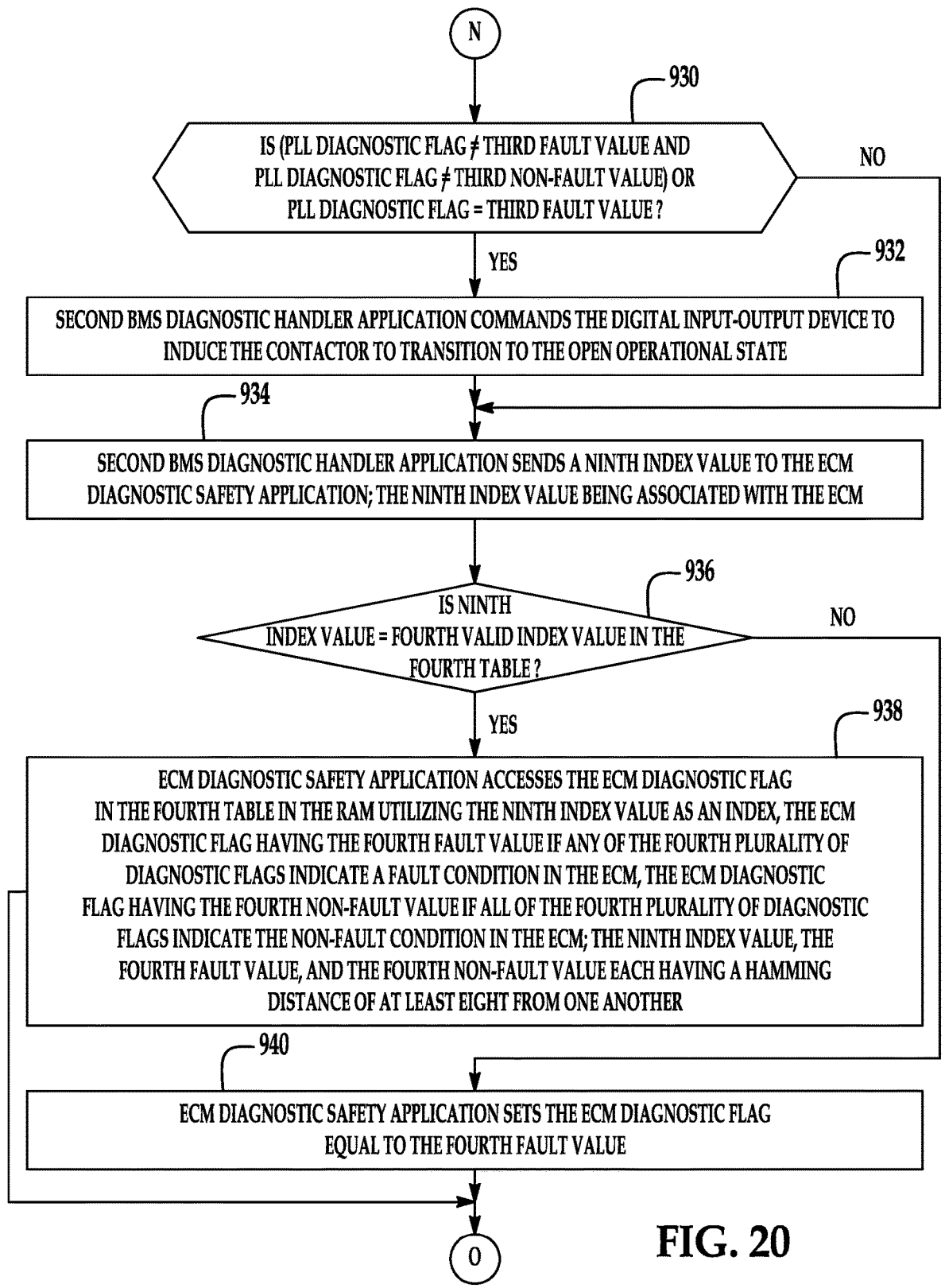
Figure 21:
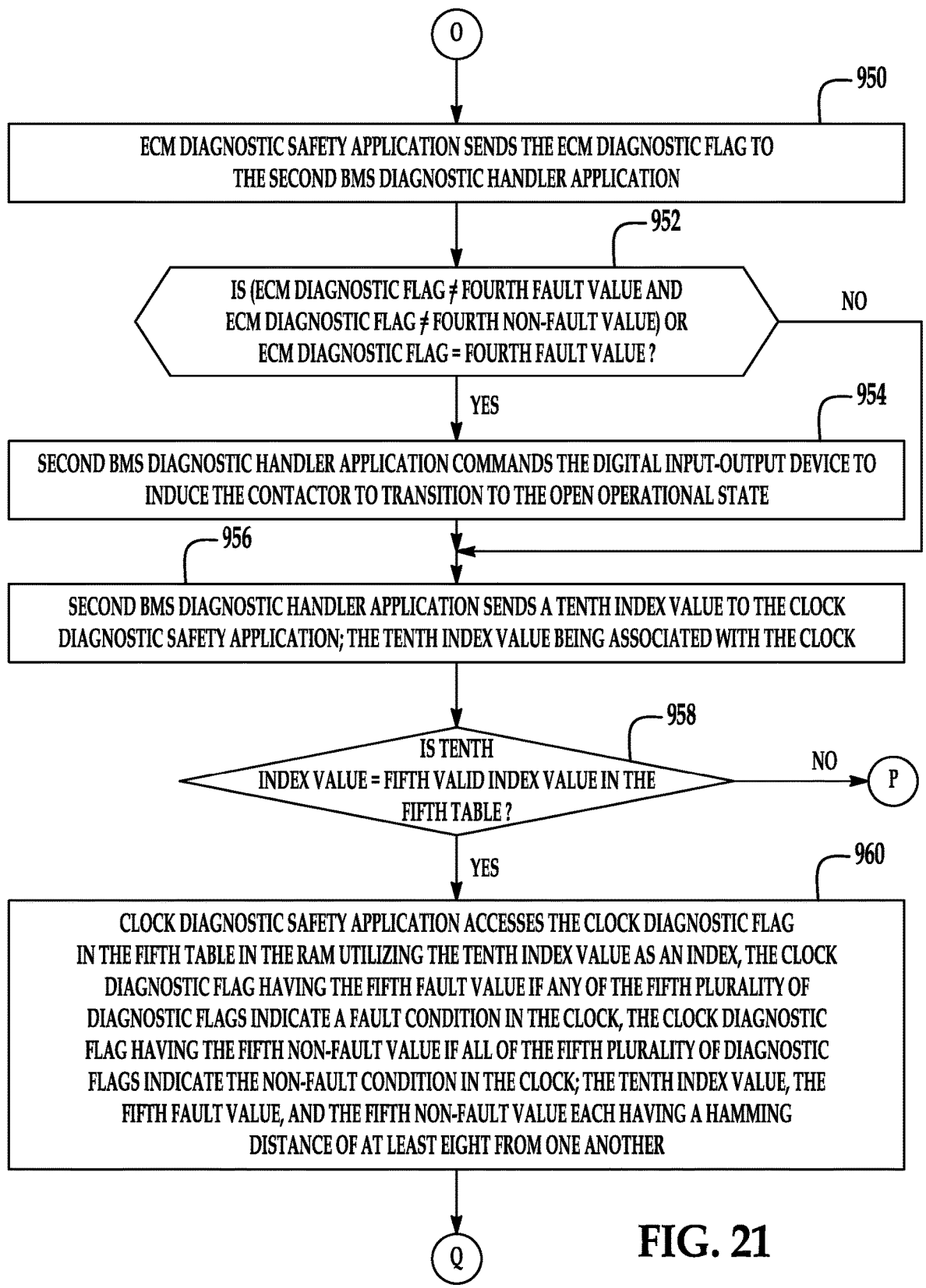
Figure 22:
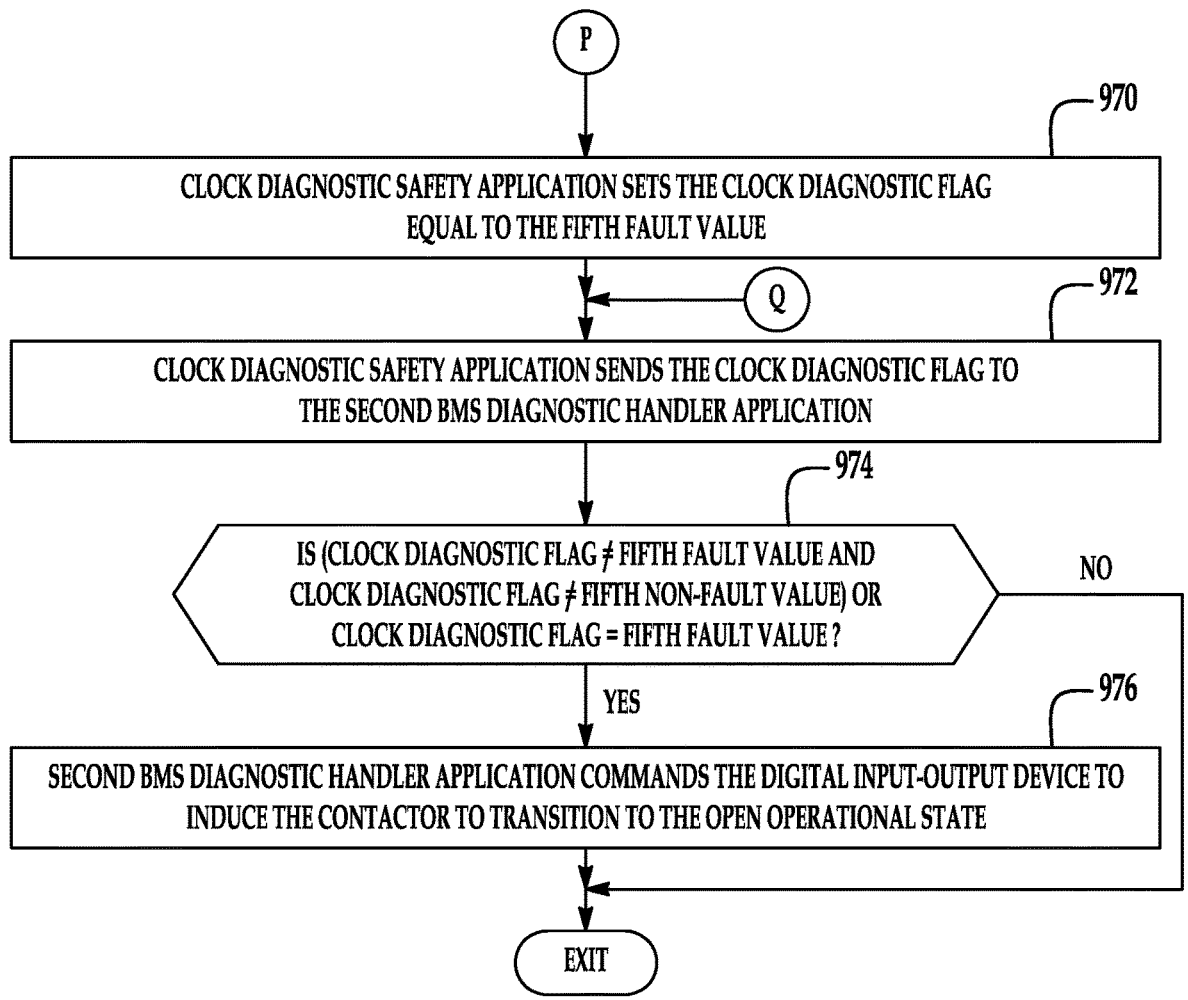

Referring to FIGS. 1 and 2, the RAM memory 393 includes an ADC diagnostic safety mechanism 500, a DMA diagnostic safety mechanism 502, a PLL diagnostic safety mechanism 504, an ECM diagnostic safety mechanism 506, a clock diagnostic safety mechanism 508, a first BMS diagnostic handler application 520, a second BMS diagnostic handler application 522.

The RAM memory 393 further includes the application-specific diagnostic safety applications 524 including an ADC diagnostic safety application 530, a DMA diagnostic safety application 532, a PLL diagnostic safety application 534, an ECM diagnostic safety application 536, and a clock diagnostic safety application 538. The ADC diagnostic safety application 530 determines whether the ADC 400 is malfunctioning during runtime. The DMA diagnostic safety application 532 determines whether the configuration of the DMA 402 is corrupted during runtime. The PLL diagnostic safety application 534 determines whether an oscillating crystal 403 is outputting a signal at a desired frequency to the PLL 404 during runtime. The ECM diagnostic safety application 536 determines whether the ECM 406 is operating as desired during runtime. The clock diagnostic safety application 538 determines whether the clock 408 is outputting at a desired clock frequency signal during runtime.

The functionality of the above-identified mechanisms and applications will be described in the flowchart herein.

Referring to FIG. 3, for understanding how valid index values are associated with the application-specific components, a master microcontroller index table 600 having the records 602, 604, 606, 608, 610 is illustrated. Each of the records have the following fields: an application-specific component name, an index name, and a valid index value. In particular, the record 602 has an application-specific component name of "ADC, an index name of "first index", and a valid index value of "1EE1" hexadecimal. The record 604 has an application-specific component name of "DMA, an index name of "second index", and a valid index value of "4BB4" hexadecimal. Further, the record 606 has an application-specific component name of "PLL", an index name of "third index", and a valid index value of "D44D" hexadecimal. Also, the record 608 has an application-specific component name of "ECM", an index name of "fourth index", and a valid index value of "2772" hexadecimal. Further, the record 610 has an application-specific component name of "clock", an index name of "fifth index", and a valid index value of "7447" hexadecimal.

The tables utilized by the above-identified applications will now be described.

Referring to FIG. 4, a master table 620 for application-specific component diagnostic flags that is stored in the RAM 393 and utilized by the microprocessor 392 is illustrated. The master table 620 has records 622, 624, 626, 628, 630. Each of the records have the following fields: an application-specific component diagnostic flag name, a valid index value, a non-fault value, and a fault value. Each valid index value, non-fault value, and fault value in a respective record has a Hamming distance of at least eight from one another which allows any inadvertent overwrite of this data to be detected.

In an exemplary embodiment, the record 622 has an application-specific component diagnostic flag name of "ADC diagnostic flag, a valid index value of "1EE1" hexadecimal, a non-fault value of "D88D" hexadecimal, and a fault value of "8DD8" hexadecimal.

The record 624 has an application-specific component diagnostic flag name of "DMA diagnostic flag", a valid index value of "4BB4" hexadecimal, a non-fault value of "E22E" hexadecimal, and a fault value of "2EE2" hexadecimal.

Also, the record 626 has an application-specific component diagnostic flag name of "PLL diagnostic flag", a valid index value of "D44D" hexadecimal, a non-fault value of "1BB1" hexadecimal, and a fault value of "B11B" hexadecimal.

Further, the record 628 has an application-specific component diagnostic flag name of "ECM diagnostic flag", a valid index value of "2772" hexadecimal, a non-fault value of "B44B" hexadecimal, and a fault value of "4BB4" hexadecimal.

The record 630 has an application-specific component diagnostic flag name of "clock diagnostic flag", a valid index value of "7447" hexadecimal, a non-fault value of "4DD4" hexadecimal, and a fault value of "D44D" hexadecimal.

Referring to FIG. 5, a first table 640 associated with the ADC 400, that is stored in the RAM 393 and utilized by the microprocessor 392 is illustrated. The first table 640 has a record 642 with a first valid index value of "1EE1" hexadecimal, and an ADC diagnostic flag. The ADC diagnostic flag has a value of "D88D" hexadecimal if no-faults have been detected in the ADC 400, or "8DD8" hexadecimal if a fault has been detected in the ADC 400 by the ADC diagnostic mechanism 500.

Referring to FIG. 6, a second table 650 associated with the DMA 402, that is stored in the RAM 393 and utilized by the microprocessor 392 is illustrated. The second table has a record 652 with a second valid index value of "4BB4" hexadecimal, and a DMA diagnostic flag. The DMA diagnostic flag has a value of "E22E" hexadecimal if no-faults have been detected in the DMA 402, or "2EE2" hexadecimal if a fault has been detected in the DMA 402 by the DMA diagnostic mechanism 502.

Referring to FIG. 7, a third table 660 associated with the PLL 404 that is stored in the RAM 393 and utilized by the microprocessor 392 is illustrated. The third table 660 has a record 662 with a third valid index value of "D44D" hexadecimal, and a PLL diagnostic flag. The PLL diagnostic flag has a value of "1BB1" hexadecimal if no-faults have been detected in the PLL 404, or "B11B" hexadecimal if a fault has been detected in the PLL 404 by the PLL diagnostic mechanism 504.

Referring to FIG. 8, a fourth table 670 associated with the ECM 406 that is stored in the RAM 393 and utilized by the microprocessor 392 is illustrated. The fourth table 670 has a record 672 with a fourth valid index value of "2772" hexadecimal, and an ECM diagnostic flag. The ECM diagnostic flag has a value of "B44B" hexadecimal if no-faults have been detected in the ECM 406, or "4BB4" hexadecimal if a fault has been detected in the ECM 406 by the ECM diagnostic mechanism 506.

Referring to FIG. 9, a fifth table 680 associated with the clock 408 that is stored in the RAM 393 and utilized by the microprocessor 392 is illustrated. The fifth table 680 has a record 682 with a fifth valid index value of "7447" hexadecimal, and a clock diagnostic flag. The clock diagnostic flag has a value of "4DD4" hexadecimal if no-faults have been detected in the clock 408, or "D44D" hexadecimal if a fault has been detected in the clock 408 by the clock diagnostic mechanism 508.

Referring to FIGS. 1, 4-9 and 10-22, a flowchart of a diagnostic method implemented by the diagnostic system 24 will be explained.

At step 750, the ADC diagnostic safety mechanism 500 sets an ADC diagnostic flag to a first fault value (e.g., 8DD8 hexadecimal) in a first table 640 (shown in FIG. 5) in a RAM 393 if any of a first plurality of diagnostic flags indicate a fault condition in an ADC 400 after a startup operation of the microcontroller 380, and sets the ADC diagnostic flag to a first non-fault value (e.g., D88D hexadecimal) if all of the first plurality of diagnostic flags indicate a non-fault condition in the ADC 400. After step 750, the method advances to step 752.

At step 752, the DMA diagnostic safety mechanism 502 sets a DMA diagnostic flag to a second fault value (e.g., 2EE2 hexadecimal) in a second table 650 (shown in FIG. 6) in the RAM 393 if any of a second plurality of diagnostic flags indicate a fault condition in a DMA 402 after the startup operation of the microcontroller 380, and sets the DMA diagnostic flag to a second non-fault value (e.g., E22E hexadecimal) if all of the second plurality of diagnostic flags indicate a non-fault condition in the DMA 402. After step 752, the method advances to step 754.

At step 754, the PLL diagnostic safety mechanism 504 sets a PLL diagnostic flag to a third fault value (e.g., B11B hexadecimal) in a third table 660 (shown in FIG. 7) in the RAM 393 if any of a third plurality of diagnostic flags indicate a fault condition in a PLL 404 after the startup operation of the microcontroller 380, and sets the PLL diagnostic flag to a third non-fault value (e.g., 1BB1 hexadecimal) if all of the third plurality of diagnostic flags indicate a non-fault condition in the PLL 404. After step 754, the method advances to step 756.

At step 756, the ECM diagnostic safety mechanism 506 sets an ECM diagnostic flag to a fourth fault value (e.g., 4BB4 hexadecimal) in a fourth table 670 (shown in FIG. 8) in the RAM 393 if any of a fourth plurality of diagnostic flags indicate a fault condition in an ECM 406 after the startup operation of the microcontroller 380, and sets the ECM diagnostic flag to a fourth non-fault value (e.g., B44B hexadecimal) if all of the fourth plurality of diagnostic flags indicate a non-fault condition in the ECM 406. After step 756, the method advances to step 760.

At step 760, the clock diagnostic safety mechanism 508 sets a clock diagnostic flag to a fifth fault value (e.g., D44D hexadecimal) in a fifth table 680 (shown in FIG. 9) if any of a fifth plurality of diagnostic flags indicate a fault condition in a clock 408 after a startup operation of the microcontroller 380, and sets the clock diagnostic flag to a fifth non-fault value (e.g., 4DD4 hexadecimal) if all of the fifth plurality of diagnostic flags indicate a non-fault condition in the clock 408. After step 760, the method advances to step 762.

At step 762, the first BMS diagnostic handler application 520 sends a first index value (e.g., 1EE1 hexadecimal) to the ADC diagnostic safety application 530. The first index value is associated with the ADC 400. After step 762, the method advances to step 764.

At step 764, the microprocessor 392 makes a determination as to whether the first index value is equal to the first valid index value in the first table 640. If the value of step 764 equals "yes", the method advances to step 766. Otherwise, the method advances to step 768.

At step 766, the ADC diagnostic safety application 530 accesses the ADC diagnostic flag in the first table 640 in the RAM 393 utilizing the first index value (e.g., 1EE1 hexadecimal) as an index. The ADC diagnostic flag has the first fault value (e.g., 8DD8 hexadecimal) if any of the first plurality of diagnostic flags indicate a fault condition in the ADC 400. The ADC diagnostic flag has the first non-fault value (e.g., D88D hexadecimal) if all of the first plurality of diagnostic flags indicate the non-fault condition in the ADC 400. The first index value, the first fault value, and the first non-fault value each have a Hamming distance of at least eight from one another. After step 766, the method advances to step 770.

Referring again to step 764, if the value of step 764 equals "no", the method advances to step 768. At step 768, the ADC diagnostic safety application 530 sets the ADC diagnostic flag equal to the first fault value (e.g., 8DD8 hexadecimal) since an invalid index value was received. After step 768, the method advances to step 770.

At step 770, the ADC diagnostic safety application 530 sends the ADC diagnostic flag to the first BMS diagnostic handler application 520. After step 770, the method advances to step 780.

At step 780, the microprocessor 392 makes a determination as to whether the ADC diagnostic flag is not equal to the first fault value and the ADC diagnostic flag is not equal to the first non-fault value, or the ADC diagnostic flag is equal to the first fault value. If the value of step 780 equals "yes", the method advances to step 782. Otherwise, the method advances to step 784.

At step 782, the first BMS diagnostic handler application 520 commands the digital input-output device 394 to induce the contactor 70 to transition to an open operational state. After step 782, the method advances to step 784.

At step 784, the first BMS diagnostic handler application 520 sends a second index value (e.g., 4BB4 hexadecimal) to the DMA diagnostic safety application 532. The second index value is associated with the DMA 402. After step 784, the method advances to step 786.

At step 786, the microprocessor 392 makes a determination as to whether the second index value is equal to the second valid index value in the second table 650. If the value of step 786 equals "yes", the method advances to step 788. Otherwise, the method advances to step 790.

At step 788, the DMA diagnostic safety application 532 accesses the DMA diagnostic flag in the second table 650 in the RAM 393 utilizing the second index value as an index. The DMA diagnostic flag has the second fault value (e.g., 2EE2 hexadecimal) if any of the second plurality of diagnostic flags indicate a fault condition in the DMA 402. The DMA diagnostic flag has the second non-fault value (e.g., E22E hexadecimal) if all of the second plurality of diagnostic flags indicate the non-fault condition in the DMA 402. The second index value, the second fault value, and the second non-fault value each have a Hamming distance of at least eight from one another. After step 788, the method advances to step 800.

Referring again to step 786, if the value of step 786 equals "no", the method advances to step 790. At step 790, the DMA diagnostic safety application 532 sets the DMA diagnostic flag equal to the second fault value (e.g., 2EE2 hexadecimal). After step 790, the method advances to step 800.

At step 800, the DMA diagnostic safety application 532 sends the DMA diagnostic flag to the first BMS diagnostic handler application 520. After step 800, the method advances to step 802.

At step 802, the microprocessor 392 makes a determination as to whether the DMA diagnostic flag is not equal to the second fault value and the DMA diagnostic flag is not equal to the second non-fault value, or the DMA diagnostic flag is equal to the second fault value. If the value of step 802 equals "yes", the method advances to step 804. Otherwise, the method advances to step 806.

At step 804, the first BMS diagnostic handler application 520 commands the digital input-output device 394 to induce the contactor 70 to transition to the open operational state. After step 804, the method advances to step 806.

At step 806, the first BMS diagnostic handler application 520 sends a third index value (e.g., D44D hexadecimal) to the PLL diagnostic safety application 534. The third index value is associated with the PLL 404. After step 806, the method advances to step 808.

At step 808, the microprocessor 392 makes a determination as to whether the third index value is equal to the third valid index value in the third table 660. If the value of step 808 equals "yes", the method advances to step 810. Otherwise, the method advances to step 820.

At step 810, the PLL diagnostic safety application 534 accesses the PLL diagnostic flag in the third table 660 in the RAM 393 utilizing the third index value as an index. The PLL diagnostic flag has the third fault value (e.g., B11B hexadecimal) if any of the third plurality of diagnostic flags indicate a fault condition in the PLL 404. The PLL diagnostic flag has the third non-fault value (e.g., 1BB1 hexadecimal) if all of the third plurality of diagnostic flags indicate the non-fault condition in the PLL 404. The third index value, the third fault value, and the third non-fault value each have a Hamming distance of at least eight from one another. After step 810, the method advances to step 822.

Referring again to step 808, if the value of step 808 equals "no", the method advances to step 820. At step 820, the PLL diagnostic safety application 534 sets the PLL diagnostic flag equal to the third fault value (e.g., B11B hexadecimal). After step 820, the method advances to step 822.

At step 822, the PLL diagnostic safety application 534 sends the PLL diagnostic flag to the first BMS diagnostic handler application 520. After step 822, the method advances to step 824.

At step 824, the microprocessor 392 makes a determination as to whether the PLL diagnostic flag is not equal to the third fault value and the PLL diagnostic flag is not equal to the third non-fault value, or the PLL diagnostic flag is equal to the third fault value. If the value of step 824 equals "yes", the method advances to step 826. Otherwise, the method advances to step 828.

At step 826, the first BMS diagnostic handler application 520 commands the digital input-output device 394 to induce the contactor 70 to transition to the open operational state. After step 826, the method advances the step 828.

At step 828, the first BMS diagnostic handler application 520 sends a fourth index value (e.g., 2772 hexadecimal) to the ECM diagnostic safety application 536. The fourth index value is associated with the ECM 406. After step 828, the method advances to step 830.

At step 830, the microprocessor 392 makes a determination as to whether the fourth index value is equal to the fourth valid index value in the fourth table 670. If the value of step 830 equals "yes", the method advances to step 840. Otherwise, the method advances to step 842.

At step 840, the ECM diagnostic safety application 536 accesses the ECM diagnostic flag in the fourth table 670 in the RAM 393 utilizing the fourth index value (e.g., 2772 hexadecimal) as an index. The ECM diagnostic flag has the fourth fault value (e.g., 4BB4 hexadecimal) if any of the fourth plurality of diagnostic flags indicate a fault condition in the ECM 406. The ECM diagnostic flag has the fourth non-fault value (e.g., B44B hexadecimal) if all of the fourth plurality of diagnostic flags indicate the non-fault condition in the ECM 406. The fourth index value, the fourth fault value, and the fourth non-fault value each have a Hamming distance of at least eight from one another. After step 840, the method advances to step 844.

Referring again to step 830, if the value of step 830 equals "no", the method advances to step 842. At step 842, the ECM diagnostic safety application 536 sets the ECM diagnostic flag equal to the fourth fault value (e.g., 4BB4 hexadecimal). After step 842, the method advances to step 844.

At step 844, the ECM diagnostic safety application 536 sends the ECM diagnostic flag to the first BMS diagnostic handler application 520. After step 844, the method advances to step 846.

At step 846, the microprocessor 392 makes a determination as to whether the ECM diagnostic flag is not equal to the fourth fault value and the ECM diagnostic flag is not equal to the fourth non-fault value, or the ECM diagnostic flag is equal to the fourth fault value. If the value of step 846 equals "yes", the method advances to step 848. Otherwise, the method advances to step 850.

At step 848, the first BMS diagnostic handler application 520 commands the digital input-output device 394 to induce the contactor 70 to transition to the open operational state. After step 848, the method advances to step 850.

At step 850, the first BMS diagnostic handler application 520 sends a fifth index value (e.g., 7447 hexadecimal) to the clock diagnostic safety application 538. The fifth index value is associated with the clock 408. After step 850, the method advances to step 852.

At step 852, the microprocessor 392 makes a determination as to whether the fifth index value is equal to the fifth valid index value in the fifth table 680. If the value of step 852 equals "yes", the method advances to step 854. Otherwise, the method advances to step 856.

At step 854, the clock diagnostic safety application 538 accesses the clock diagnostic flag in the fifth table 680 in the RAM 393 utilizing the fifth index value (e.g., 7447 hexadecimal) as an index. The clock diagnostic flag has the fifth fault value (e.g., D44D hexadecimal) if any of the fifth plurality of diagnostic flags indicate a fault condition in the clock 408. The clock diagnostic flag has the fifth non-fault value (e.g., 4DD4 hexadecimal) if all of the fifth plurality of diagnostic flags indicate the non-fault condition in the clock 408. The fifth index value, the fifth fault value, and the fifth non-fault value each have a Hamming distance of at least eight from one another. After step 854, the method advances to step 858.

Referring again to step 852, if the value of step 852 equals "no", the method advances to step 856. At step 856, the clock diagnostic safety application 538 sets the clock diagnostic flag equal to the fifth fault value (e.g., D44D hexadecimal). After step 856, the method advances to step 858.

At step 858, the clock diagnostic safety application 538 sends the clock diagnostic flag to the first BMS diagnostic handler application 520. After step 858, the method advances to step 860.

At step 860, the microprocessor 392 makes a determination as to whether the clock diagnostic flag is not equal to the fifth fault value and the clock diagnostic flag is not equal to the fifth non-fault value, or the clock diagnostic flag is equal to the fifth fault value. If the value of step 860 equals "yes", the method advances to step 862. Otherwise, the method advances to step 870.

At step 862, the first BMS diagnostic handler application 520 commands the digital input-output device 394 to induce the contactor 70 to transition to the open operational state. After step 862, the method advances to step 870.

At step 870, the second BMS diagnostic handler application 522 sends a sixth index value (e.g., 1EE1 hexadecimal) to the ADC diagnostic safety application 530. The sixth index value is associated with the ADC 400. After step 870, the method advances to step 872.

At step 872, the microprocessor 392 makes a determination as to whether the sixth index value is equal to the first valid index value in the first table 640. If the value of step 872 equals "yes", the method advances to step 874. Otherwise, the method advances to step 876.

At step 874, the ADC diagnostic safety application 530 accesses the ADC diagnostic flag in the first table 640 in the RAM 393 utilizing the sixth index value (e.g., 1EE1 hexadecimal) as an index. The ADC diagnostic flag has the first fault value (e.g., 8DD8 hexadecimal) if any of the first plurality of diagnostic flags indicate a fault condition in the ADC 400. The ADC diagnostic flag has the first non-fault value (e.g., D88D hexadecimal) if all of the first plurality of diagnostic flags indicate the non-fault condition in the ADC 400. The sixth index value, the first fault value, and the first non-fault value each have a Hamming distance of at least eight from one another. After step 874, the method advances to step 878.

Referring again to step 872, if the value of step 872 equals "no", the method advances to step 874. At step 874, the ADC diagnostic safety application 530 sets the ADC diagnostic flag equal to the first fault value (e.g., 8DD8 hexadecimal). After step 874, the method advances to step 878.

At step 878, the ADC diagnostic safety application 530 sends the ADC diagnostic flag to the second BMS diagnostic handler application 522. After step 878, the method advances to step 880.

At step 880, the microprocessor 392 makes a determination as to whether the ADC diagnostic flag is not equal to the first fault value and the ADC diagnostic flag is not equal to the first non-fault value, or the ADC diagnostic flag is equal to the first fault value. If the value of step 880 equals "yes", the method advances to step 890. Otherwise, the method advances to step 892.

At step 890, the second BMS diagnostic handler application 522 commands the digital input-output device 394 to induce the contactor 70 to transition to the open operational state. After step 890, the method advances to step 892.

At step 892, the second BMS diagnostic handler application 522 sends a seventh index value (e.g., 4BB4 hexadecimal) to the DMA diagnostic safety application 532. The seventh index value is associated with the DMA 402. After step 892, the method advances to step 894.

At step 894, the microprocessor 392 makes a determination as to whether the seventh index value is equal to the second valid index value in the second table 650. If the value of step 894 equals "yes", the method advances to step 896. Otherwise, the method advances to step 898.

At step 896, the DMA diagnostic safety application 532 accesses the DMA diagnostic flag in the second table 650 in the RAM 393 utilizing the seventh index value (e.g., 4BB4 hexadecimal) as an index. The DMA diagnostic flag has the second fault value (e.g., 2EE2 hexadecimal) if any of the second plurality of diagnostic flags indicate a fault condition in the DMA 402. The DMA diagnostic flag has the second non-fault value (e.g., E22E hexadecimal) if all of the second plurality of diagnostic flags indicate the non-fault condition in the DMA 402. The seventh index value, the second fault value, and the second non-fault value each have a Hamming distance of at least eight from one another. After step 896, the method advances to step 900.

Referring again to step 894, if the value of step 894 equals "no", the method advances to step 898. At step 898, the DMA diagnostic safety application 532 sets the DMA diagnostic flag equal to the second fault value (e.g., 2EE2 hexadecimal). After step 898, the method advances to step 900.

At step 900, the DMA diagnostic safety application 532 sends the DMA diagnostic flag to the second BMS diagnostic handler application 522. After step 900, the method advances to step 902.

At step 902, the microprocessor 392 makes a determination as to whether the DMA diagnostic flag is not equal to the second fault value and the DMA diagnostic flag is not equal to the second non-fault value, or the DMA diagnostic flag is equal to the second fault value. If the value of step 902 equals "yes", the method advances to step 910. Otherwise, the method advances to step 912.

At step 910, the second BMS diagnostic handler application 522 commands the digital input-output device 394 to induce the contactor 70 to transition to the open operational state. After step 910, the method advances step 912.

At step 912, the second BMS diagnostic handler application 522 sends an eighth index value (e.g., D44D hexadecimal) to the PLL diagnostic safety application 534. The eighth index value is associated with the PLL 404. After step 912, the method advances to step 914.

At step 914, the microprocessor 392 makes a determination as to whether the eighth index value is equal to the third valid index value in the third table 660. If the value of step 914 equals "yes", the method advances to step 916. Otherwise, the method advances to step 918.

At step 916, the PLL diagnostic safety application 534 accesses the PLL diagnostic flag in the third table 660 in the RAM 393 utilizing the eighth index value (e.g., D44D hexadecimal) as an index. The PLL diagnostic flag has the third fault value (e.g., B11B hexadecimal) if any of the third plurality of diagnostic flags indicate a fault condition in the PLL 404. The PLL diagnostic flag has the third non-fault value (e.g., 1BB1 hexadecimal) if all of the third plurality of diagnostic flags indicate the non-fault condition in the PLL 404. The eighth index value, the third fault value, and the third non-fault value each have a Hamming distance of at least eight from one another. After step 916, the method advances to step 920.

Referring again to step 914, if the value of step 914 equals "no", the method advances to step 918. At step 918, the PLL diagnostic safety application 534 sets the PLL diagnostic flag equal to the third fault value (e.g., B11B hexadecimal). After step 918, the method advances to step 920.

At step 920, the PLL diagnostic safety application 534 sends the PLL diagnostic flag to the second BMS diagnostic handler application 522. After step 920, the method advances to step 930.

At step 930, the microprocessor 392 makes a determination as to whether the PLL diagnostic flag is not equal to the third fault value and the PLL diagnostic flag is not equal to the third non-fault value, or the PLL diagnostic flag is equal to the third fault value. If the value of step 930 equals "yes", the method advances to step 932. Otherwise, the method advances to step 934.

At step 932, the second BMS diagnostic handler application 522 commands the digital input-output device 394 to induce the contactor 70 to transition to the open operational state. After step 932, the method advances to step 934.

At step 934, the second BMS diagnostic handler application 522 sends a ninth index value (e.g., 2772 hexadecimal) to the ECM diagnostic safety application 536. The ninth index value is associated with the ECM 406. After step 934, the method advances to step 936.

At step 936, the microprocessor 392 makes a determination as to whether the ninth index value is equal to the fourth valid index value in the fourth table 670. If the value of step 936 equals "yes", the method advances to step 938. Otherwise, the method advances to step 940.

At step 938, the ECM diagnostic safety application 536 accesses the ECM diagnostic flag in the fourth table 670 in the RAM 393 utilizing the ninth index value (e.g., 2772 hexadecimal) as an index. The ECM diagnostic flag has the fourth fault value (e.g., 4BB4 hexadecimal) if any of the fourth plurality of diagnostic flags indicate a fault condition in the ECM 406. The ECM diagnostic flag has the fourth non-fault value (e.g., B44B hexadecimal) if all of the fourth plurality of diagnostic flags indicate the non-fault condition in the ECM 406. The ninth index value, the fourth fault value, and the fourth non-fault value each have a Hamming distance of at least eight from one another. After step 938, the method advances to step 950.

Referring again to step 936, if the value of step 936 equals "no", the method advances to step 940. At step 940, the ECM diagnostic safety application 536 sets the ECM diagnostic flag equal to the fourth fault value (e.g., 4BB4 hexadecimal). After step 940, the method advances to step 950.

At step 950, the ECM diagnostic safety application 536 sends the ECM diagnostic flag to the second BMS diagnostic handler application 522. After step 950, the method advances to step 952.

At step 952, the microprocessor 392 makes a determination as to whether the ECM diagnostic flag is not equal to the fourth fault value and the ECM diagnostic flag is not equal to the fourth non-fault value, or the ECM diagnostic flag is equal to the fourth fault value. If the value of step 952 equals "yes", the method advances to step 954. Otherwise, the method advances to step 956.

At step 954, the second BMS diagnostic handler application 522 commands the digital input-output device 394 to induce the contactor 70 to transition to the open operational state. After step 954, the method advances to step 956.

At step 956, the second BMS diagnostic handler application 522 sends a tenth index value (e.g., 7447 hexadecimal) to the clock diagnostic safety application 538. The tenth index value is associated with the clock 408. After step 956, the method advances to step 958.

At step 958, the microprocessor 392 makes a determination as to whether the tenth index value is equal to the fifth valid index value in the fifth table 680. If the value of step 958 equals "yes", the method advances to step 960. Otherwise, the method advances to step 970.

At step 960, the clock diagnostic safety application 538 accesses the clock diagnostic flag in the fifth table 680 in the RAM 393 utilizing the tenth index value (e.g., 7447 hexadecimal) as an index. The clock diagnostic flag has the fifth fault value (e.g., D44D hexadecimal) if any of the fifth plurality of diagnostic flags indicate a fault condition in the clock 408. The clock diagnostic flag has the fifth non-fault value (e.g., 4DD4 hexadecimal) if all of the fifth plurality of diagnostic flags indicate the non-fault condition in the clock 408. The tenth index value, the fifth fault value, and the fifth non-fault value each have a Hamming distance of at least eight from one another. After step 960, the method advances to step 972.

Referring again to step 958, if the value of step 958 equals "no", the method advances to step 970. At step 970, the clock diagnostic safety application 538 sets the clock diagnostic flag equal to the fifth fault value (e.g., D44D hexadecimal). After step 970, the method advances to step 972.

At step 972, the clock diagnostic safety application 538 sends the clock diagnostic flag to the second BMS diagnostic handler application 522. After step 972, the method advances to step 974.

At step 974, the microprocessor 392 makes a determination as to whether the clock diagnostic flag is not equal to the fifth fault value and the clock diagnostic flag is not equal to the fifth non-fault value, or the clock diagnostic flag is equal to the fifth fault value. If the value of step 974 equals "yes", the method advances to step 976. Otherwise, the method is exited.

At step 976, the second BMS diagnostic handler application 522 commands the digital input-output device 394 to induce the contactor 70 to transition to the open operational state. After step 976, the method is exited.

The diagnostic system described herein provides a substantial advantage over other systems. In particular, the diagnostic system for a battery management system described herein utilizes a diagnostic handler application that sends an index value to an application-specific component diagnostic safety application, and in response the application-specific component diagnostic safety application accesses a diagnostic flag in RAM and sends the diagnostic flag to the diagnostic handler application. As a result, the diagnostic handler application cannot directly access the diagnostic flag in RAM which prevents the diagnostic handler application from inadvertently overwriting the diagnostic flag in the RAM.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a battery management system, comprising:
    a cell voltage monitoring IC that monitors voltages of a plurality of battery cells;
    a microcontroller having a RAM, application-specific components, a first BMS diagnostic handler application, and an application-specific component diagnostic safety application; the microcontroller being operably coupled to the cell voltage monitoring IC;
    the first BMS diagnostic handler application sending a first index value to the application-specific component diagnostic safety application; the first index value being associated with a first application-specific component of the application-specific components;
    the application-specific component diagnostic safety application accessing an application-specific component diagnostic flag in a first table in the RAM if the first index value is equal to a valid index value in the first table, the application-specific component diagnostic flag having a first fault value if any of the plurality of diagnostic flags indicate a fault condition in the first application-specific component, the application-specific component diagnostic flag having a first non-fault value if all of a plurality of diagnostic flags indicate a non-fault condition in the first application-specific component; the first index value, the first fault value, and the first non-fault value each having a Hamming distance of at least eight from one another; and
    the application-specific component diagnostic safety application sending the application-specific component diagnostic flag to the first BMS diagnostic handler application.

2. The diagnostic system of claim 1, wherein the first index value prevents the first BMS diagnostic handler application from directly accessing a memory location in the RAM having the application-specific component diagnostic flag which prevents inadvertent overwriting of the application-specific component diagnostic flag.

3. The diagnostic system of claim 1, wherein:
the microcontroller further having a second BMS diagnostic handler application;
the second BMS diagnostic handler application sending a second index value to the application-specific component diagnostic safety application; the second index value being associated with the first application-specific component; the second index value, the first fault value, and the first non-fault value each having a Hamming distance of at least eight from one another;
the application-specific component diagnostic safety application accessing the application-specific component diagnostic flag in the first table in the RAM if the second index value is equal to the valid index value in the first table; and
the application-specific component diagnostic safety application sending the application-specific component diagnostic flag to the second BMS diagnostic handler application.

4. The diagnostic system of claim 3, wherein the second index value prevents the second BMS diagnostic handler application from directly accessing the memory location in the RAM having the application-specific component diagnostic flag which prevents inadvertent overwriting of the application-specific component diagnostic flag.

5. The diagnostic system of claim 3, wherein the microcontroller further includes a digital input-output device;
the first BMS diagnostic handler application commanding the digital input-output device to induce a contactor to transition to an open operational state if the application-specific component diagnostic flag is equal to the first fault value; and
the second BMS diagnostic handler application commanding the digital input-output device to induce the contactor to transition to the open operational state if the application-specific component diagnostic flag is equal to the first fault value.

6. The diagnostic system of claim 1, wherein:
the microcontroller further includes a microprocessor; and
the application-specific components including an analog-to-digital converter (ADC), a direct memory access (DMA) module, a phase lock loop (PLL), an error control manager (ECM), and a clock; the DMA module being operably coupled to the cell voltage monitoring IC.

7. The diagnostic system of claim 1, wherein:
the first application-specific component being an analog-to-digital converter (ADC);
the application-specific component diagnostic safety application being an ADC diagnostic safety application; and
the application-specific component diagnostic flag being an ADC diagnostic flag.

8. The diagnostic system of claim 1, wherein:
the first application-specific component being a direct memory access (DMA) module;
the application-specific component diagnostic safety application being a DMA diagnostic safety application; and
the application-specific component diagnostic flag being a DMA diagnostic flag.

9. The diagnostic system of claim 1, wherein:
the first application-specific component being a phase lock loop (PLL);
the application-specific component diagnostic safety application being a PLL diagnostic safety application; and
the application-specific component diagnostic flag being a PLL diagnostic flag.

10. The diagnostic system of claim 1, wherein:
the first application-specific component being an error control manager (ECM);
the application-specific component diagnostic safety application being an ECM diagnostic safety application; and
the application-specific component diagnostic flag being an ECM diagnostic flag.

11. The diagnostic system of claim 1, wherein:
the first application-specific component being a clock;
the application-specific component diagnostic safety application being a clock diagnostic safety application; and
the application-specific component diagnostic flag being a clock diagnostic flag.

\* \* \* \* \*